United States Patent
Kawai et al.

(10) Patent No.: US 6,861,122 B2
(45) Date of Patent: Mar. 1, 2005

(54) CERAMIC MEMBER WITH FINE PROTRUSIONS ON SURFACE AND METHOD OF PRODUCING THE SAME

(75) Inventors: Kazuhide Kawai, Aichi (JP); Shunzo Shimai, Chiba (JP); Makoto Takahashi, Kanagawa (JP); Hiroaki Shitara, Kanagawa (JP); Fumio Tokuoka, Kanagawa (JP); Masahiko Ichishima, Kanagawa (JP); Takashi Suzuki, Kanagawa (JP); Toyokazu Matsuyama, Kanagawa (JP); Hideo Uemoto, Kanagawa (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 182 days.

(21) Appl. No.: 10/059,133

(22) Filed: Jan. 31, 2002

(65) Prior Publication Data

US 2003/0019843 A1 Jan. 30, 2003

(30) Foreign Application Priority Data

| Jan. 31, 2001 | (JP) | 2001-023829 |
|---|---|---|
| Feb. 9, 2001 | (JP) | 2001-033102 |
| Dec. 4, 2001 | (JP) | 2001-369519 |
| Dec. 4, 2001 | (JP) | 2001-369736 |
| Dec. 4, 2001 | (JP) | 2001-369945 |
| Dec. 4, 2001 | (JP) | 2001-369950 |
| Dec. 4, 2001 | (JP) | 2001-369953 |
| Dec. 4, 2001 | (JP) | 2001-370168 |

(51) Int. Cl.[7] .............................. B32B 3/00; C23F 1/14
(52) U.S. Cl. .................... 428/141; 428/148; 428/220; 428/304.4; 428/689; 428/698; 428/701; 428/702; 216/56; 216/96; 216/103; 216/108
(58) Field of Search ............................. 428/304.4, 689, 428/698, 701, 702, 206, 220, 141, 143, 148, 149; 216/56, 96, 103, 108

(56) References Cited

U.S. PATENT DOCUMENTS 5,582,215 A * 12/1996 Yamamoto et al. .......... 140/105
6,340,648 B1 * 1/2002 Imura et al. ................... 501/80

FOREIGN PATENT DOCUMENTS

| JP | 10-45461 | 2/1998 |
| JP | 10-236871 | 9/1998 |
| JP | 411057355 A * | 3/1999 |
| JP | 11-231085 | 8/1999 |
| JP | 2000-191370 | 7/2000 |
| JP | 2000-281470 | 10/2000 |

OTHER PUBLICATIONS

Schacht et al., "Corrosion of Alumina Ceramics in Acidic Aqueous Solutions at High Temperatures and Pressures," 2000 Kluwer Academic Publishers, May 2000, pp. 6251–6258.

* cited by examiner

Primary Examiner—Jennifer McNeil
(74) Attorney, Agent, or Firm—Foley & Lardner LLP

(57) ABSTRACT

The ceramic member of this invention is formed on the surfaces of crystal grains with a plurality of protrusions having smaller diameter than that of the crystal grain, said crystal grain composing at least the surface or its vicinity of a dense ceramic base material of purity being 95 wt % or higher. Such ceramic members may be produced by performing the surface of a dense ceramic base material with a corrosion treatment in an acid etchant, the dense ceramic base material having purity of 95 wt % or higher and exceeding 90% of a theoretical density, whereby ceramic grains existing on the surface or its vicinity of the base material are formed on the surface thereof with a plurality of protrusions.

28 Claims, 13 Drawing Sheets

CERAMIC MEMBER WITH FINE PROTRUSIONS ON SURFACE AND METHOD OF PRODUCING THE SAME

BACKGROUND OF THE INVENTION

1. Field of the Invention

The present invention relates to a ceramic member controlled with respect to a form of the surface, and a method of producing the same, and more in detail to such a ceramic member formed on the surface with fine protrusions for easily adhering or attaching heterogeneous substances and a method of producing the same.

2. Description of the Related Art

For example, in the course of producing process of semiconductor device, a fine processing step is generally composed in a film forming process as PVD or CVD, or an etching process using a corrosive gas. A rate of occupying the producing process trends to increase in company with of the processing degree of the semiconductor becoming finer and more complicated. Since the film forming process and the etching process are subjected to severe conditions such as vacuum, plasma atmosphere or high temperatures, ceramic materials having corrosion resistance are employed as a processing container exposed to plasma.

FIG. 14 is a cross sectional view showing a schematic structure of a helicon wave plasma etching. In FIG. 14, reference numeral 1 designates an etching process chamber having an etching gas supply 2 and a vacuum outlet 3, and around the outer circumference of the process chamber 1, there are installed an antenna 4, an electromagnet 5 and a permanent magnet 6. Within the process chamber 1, a lower electrode 8 is disposed for supporting a semiconductor wafer 7 as a material to be processed. The antenna 4 is connected to a first high frequency source 10 via a first matching network 9, while the lower electrode 8 is connected to a second high frequency source 12 via a second matching network 11.

The etching process depending on the etching apparatus is carried out as follows. The semiconductor wafer 7 is set on the lower electrode 8 and the interior of the etching process chamber 1 is made vacuum, followed by supplying an etching gas from the etching gas supply 2. Subsequently, the antenna 4 and the lower electrode 8 are supplied with a high frequency current of e.g., 13.56 MHz from the high frequency sources 10, 12 via the corresponding matching networks 9, 11. On the other hand, a desired current is applied to the electromagnet 5, thereby to generate a plasma of high density within the etching process chamber 1. By this plasma energy, the etching gas is decomposed into an atom like state, and the etching process is carried out on a film formed on the semiconductor wafer 7.

By the way, in this kind of the producing apparatus, as the etching gas, employed are chlorine based gases as carbon tetrachloride (CC14) or boron chloride (BC13), otherwise fluorine based gases as carbon fluoride (CF4, C4F8), nitrogen fluoride (NF3) or sulfur fluoride (SF6). Accordingly, there is a reason for requesting plasma resistance for the composing members such as the interior walls of the etching treatment chamber 1 exposed to the plasma under the corrosive gas atmosphere.

As the composing member requesting the plasma resistance, known is a ceramic sintered substance containing at least one kind as a main element, for example, in the second A group or third A group of the periodic table and having the surface roughness (Ra) being 1 $\mu$m or less and the porosity being 3% or lower (JP-A-10-45461). Another ceramic sintered substance is proposed which is formed, on the surface thereof to be exposed to the plasma, with a sintered substance of yttrium aluminum garnet of the porosity being 3% or lower, said surface being made 1 $\mu$m or less in average roughness (Ra) of the centerline (JP-A-10-236871). Incidentally, since the using parts of the plasma resistant member are of a vacuum system and at high temperatures, it is important that the using parts do not give bad influences to an atmosphere, and for example, they work inconveniently to a gas releasing property. Herein, a gas adsorption is meant by adsorbing a portion of the gas existing on the surface of the member, and as the amount of the gas adsorption is in proportion to a surface area, it is desirable that the surface is flat, taking the gas releasing property into consideration.

By the way, the film forming means utilizing the plasma energy and the etching means are involved with problems as mentioned under. For example, during forming the film, not only faces formed with the film but also the interior wall of the process chamber exposed to the plasma and faces of supporters supporting the base material formed with the film are accidentally adhered and piled with film forming particles. Phenomena occur, that parts of the film forming components adhered and piled on the interior wall and the supporting faces peel or exfoliate from the adhered faces, and small particles attach to the face formed with the film.

Re-adhesion of small particles separating from the interior wall of the process chamber interrupts the film forming for such as a circuit pattern during forming, or deteriorates quality, resulting in causing decrease of reliability or yield of the film formed products. For giving ability of preventing particle from separation, there has proposed means of making coarse the surface of the plasma resistant member composing the interior wall of the treatment chamber (JP-A-2000-191370). That is, the known means depends on a blasting treatment, so that the surface is coarsened to exceed 1 $\mu$m in the surface roughness (Ra) so as to strengthen physical connection with the adhered and piled films and lessen peeling from the surface (anchoring effect).

However, the coarsening means by the blast treatment has a problem in regard to the gas releasing property, cannot give an enough anchoring effect to the ceramic surface, and still leaves the problem of particle separation unsolved. Namely, since the coarsened surface by the coarsening means is rugged where groove-like or wave-like surface areas are broadly enlarged and flared outside (V shape in cross section), though exhibiting the anchoring effect, this effect is insufficient, and it is demanded to heighten and improve the preventing ability of particle separation. Further, since the enlargement of the areas by making the rugged surfaces and by existence of fine flaws generated owing to the blast treatment acts on the gas adsorption in the process chamber, separation and release of the adsorbed gas, the enlargement probably gives bad influences to the film forming. In addition, surfaces while being damaged immediately before exfoliation by the blasting treatment peel owing to temperature change at service thereof and have inconveniences causing particles of the surface itself of the ceramic member.

Further, a blast treatment invites decreases in mechanical strength of the ceramic material and in plasma resistance. The decrease in mechanical strength raises problems such as breakage by thermal strain while forming films particularly in a CVD process accompanying a heating. On the other hand, a plasma resistance adopts a unit for removing fine flaws from the surface by such as a mirror process, but this is defined in shapes of the ceramic material. Namely, a plane ceramic member is easily subjected to the mirror process, but in the case of three dimensionally complicated shapes, a whole removal of fine flaws is in fact extremely difficult.

Also in the etching process, at parts other than ranges directly exposed to the plasma within an chamber, products produced by reaction with the plasma are piled. Accordingly, the interior of the chamber is periodically cleansed for avoiding inconveniences brought with generation or separation of particles.

SUMMARY OF THE INVENTION

This invention has been realized in view of the above mentioned circumstances, and it is an object of the invention to offer a ceramic member where the gas releasing property is restrained and prevented, while, on the other hand, fine protrusions are formed on the surface of the ceramic member, which exhibit the excellent anchoring effect to heterogeneous substances adhered and piled on the surface of the ceramic member, and a method of producing such a ceramic member.

This invention has also been realized in view of the above mentioned circumstances, and it is an object of the invention to offer a ceramic member where the gas releasing property is restrained and prevented, while, on the other hand, the surface is made rugged, taking the excellent plasma resistance and exhibiting an anchoring effect to heterogeneous substances adhered and piled on the surface thereof, and a method of producing such a ceramic member.

Further, the invention makes use of the surface condition, enabling to improve connections with other members such as the ceramics, films, or metals, and is to offer a material applicable to broad usage as artificial bones, catalyst, bio reactor, and others.

In addition, being based on the finding that a water solution of sulfuric acid with a desired density is effective to the chemical etching of alumina ceramics, and it is an object of the invention to offer the chemical etching method of alumina ceramics, enabling to effectively the etching.

A first aspect of the invention is to provide such a ceramic member which is characterized in that crystal grains are formed on the surfaces thereof with a plurality of protrusions having smaller diameter than that of the crystal grain, the crystal grain making the surface or its vicinity of a dense ceramic base material of purity being 95 wt % or higher.

A second aspect of the invention is to provide a method of producing the ceramic member which is characterized in that a fine ceramic base material having purity of 95 wt % or higher and exceeding 90% of a theoretical density is performed on the surface thereof with a corrosion treatment in an acid etchant (or etching liquid, and called as "etchant" hereafter in the present description), whereby ceramic grains existing on the surface or its vicinity of the base material are formed on the surface thereof with a plurality of protrusions.

A third aspect of the invention is to provide such a method which is characterized in that the fine ceramic base material is performed with an acid etching process by heating the acid etchant at temperature of 100° C. or higher in the method of the second aspect of providing the ceramic member formed with a plurality of protrusions on the surface of crystal grain by a corrosion treatment in an acid etchant. In the course of heating the acid etchant, simultaneous pressurizing with 0.1 Mpa or higher is preferable to perform, if possible.

A fourth aspect of the invention is to provide such a method of producing the ceramic member which is characterized in that the acid etchant is a sulfuric acid or a water solution thereof, otherwise a phosphoric acid or a water solution thereof in the second or third aspects of the etching treatment.

A fifth aspect of the invention is a surface rugged ceramic member, which is characterized in that a dense ceramics of purity being 95 wt % or higher is made a base material, and a surface layer thereof has a rugged structure containing fine pores, each which has a diameter of 0.5 to 50 times of average grain diameters of the ceramics with large diameter portions in a depth direction.

It is more preferable that the diameter of the fine pore, which have is 0.5 to 10 times of the average diameter of the ceramics formed with the base material.

A sixth aspect of the invention is the surface rugged ceramic member, characterized in that the fine base material has the purity of 99 wt % or higher.

A seventh aspect of the invention is the surface rugged ceramic member, characterized in that the dense base material is 90 wt % or higher of a theoretical density.

A eighth aspect of the invention is the surface rugged ceramic member, characterized in that the dense base material is alumina, yttrium aluminum garnet, aluminum nitride, yttria, zirconia, and calcium phosphate based ceramics.

A ninth aspect of the invention is a method of producing a surface rugged ceramic member, which is characterized in that a dense ceramic base material of purity being 95 wt % or higher and of more than 90% of a theoretical density is subjected to a corrosion treatment on the surface thereof in an acid etchant (or etching liquid, and called as "etchant" hereafter in the present description), so that the surface layer is rugged, having pore diameter of 0.5 to 50 times of average grain diameters of the ceramics and containing fine pores with large diameter portions in a depth direction.

Herein, it is more preferable that the diameter of the fine pore is 0.5 to 10 times of the average diameter of the ceramics grain formed with the base material.

A tenth aspect of the invention is the method of producing the surface rugged ceramic member, characterized by heating the acid etchant.

A eleventh aspect of the invention is the method of producing the surface rugged ceramic member, characterized by pressurizing 0.2 MPa or higher the acid etchant.

An twelfth aspect of the invention is the method of producing the surface rugged ceramic member, characterized in that the acid etchant is a water solution containing sulfuric acid or phosphoric acid. In case of using the phosphoric acid, pressuring and heating simultaneously should be held off for the reason of dangerousness.

A thirteenth aspect of the invention is the method of producing the surface rugged ceramic member, characterized in that the ceramic base material is carried out on the surface thereof with a heat treatment at temperatures of ⅔ or higher of a melting point of the ceramics after the corrosion treatment with the acid etchant.

A fourteenth aspect of the invention is a surface rugged ceramic member, characterized in that a dense ceramics is made a base material, purity of which is 95 wt % or higher and average grain diameters are 10 to 70 µm, a surface layer thereof within 5 times of the average grain diameters contains no pulverized layers (micro cracks), and said ceramics has a rugged structure which seems as grains partially fall.

A fifteenth aspect of the invention is a surface rugged ceramic member, characterized in that the dense ceramic base material has the purity of 99 wt % or higher.

A sixteenth aspect of the invention is a surface rugged ceramic member, characterized in that the dense ceramic base material comprises one kind or more of alumina, yttrium aluminum garnet, aluminum nitride, yttria, and zirconia.

A seventeenth aspect of the invention is a method of producing a surface rugged ceramic member, characterized in that a dense ceramic base material of purity being 95 wt % or higher and average grain diameters being 10 to 70 μm is subjected to a corrosion treatment on the while removing a pulverized layer (micro cracks) from the ceramic processed surface, said ceramics has a rugged structure which seems as grains partially fall.

An eighteenth aspect of the invention is a method of producing the surface rugged ceramic member, characterized in that the acid etchant is a water solution containing sulfuric acid or phosphoric acid.

A ninteenth aspect of the invention is a chemical etching method of alumina ceramics, wherein alumina ceramics is immersed in a water solution of sulfuric acid of 18 to 50% density, and the water solution is kept at temperatures of 100 to 230° C.

DESCRIPTION OF THE PREFERRED EMBODIMENTS

Figure 1:
FIG. 1 shows an electron microscopic photograph of the ceramic member relating to the example 1 of the invention, which is produced of the ceramic base material of the ground surface.

In the first to fourth aspects of the invention, as the dense ceramic (base material), alumina may be adopted. Purity of the dense ceramic is 95 wt % or higher, preferably 99 wt % or higher. In short, because, if the purity is less than 95 wt %, when the surface is processed in the acid etchant, corrosion occurs preferentially around grain boundaries, and it is not possible to form a structure having a plurality of protrusions on the surface of a desired crystal grain.

In the third and fourth aspects of the invention, for carrying out the etching process, if the etchant is heated 100° C. or higher and preferably pressurized 0.1 Mpa or higher, a process for forming the plural protrusions on the crystal surface is progressed more easily and exactly, and it is possible to offer the ceramic member having the plural protrusions on the surface of mass-productive crystal grains. The more preferably pressurizing condition in such an etching process is 0.2 Mpa or higher.

Namely, in case the temperature is lower than 100° C. or the pressure is less than 0.1 Mpa, the corrosive action of the etchant is weak and a desired surface cannot be formed.

Herein, the acid etchant is in general the sulfuric acid or the water solution thereof otherwise the phosphoric acid or the water solution thereof. An upper limit of a heating temperature of the acid etchant is determined within a range of not generating a thermal decomposition of the sulfuric acid. In case of using the phosphoric acid, pressuring thereof should be held off for the reason of dangerousness. In the first to fourth aspects of the invention, the crystal grain composing the surface of the ceramic base material is presented on the surface thereof with the plural protrusions smaller in diameter than the crystal grain, that is, on the surface of the ceramic base material, fine protruding parts exist more in the number than the crystal grain composing the surface of the ceramic base material and direct in various orientations in response to orientations of the crystal grains. Film-like heterogeneous substances once adhered to the surfaces of the ceramic base materials are caught by protruding parts thereof, and keep conditions of not easily releasing or scattering. Accordingly it is possible to avoid inconvenience or bad conditions caused by partially releasing or scattering film forming components adhered and piled to the wall of the process chamber in the process such as a vapor deposition or a spattering.

As the surface or its neighborhood of the ceramic base material are corroded chemically and smoothly, in comparison with cases where fine cracks or flaws are generated in surface layers by a physical surface roughing process such as a sand blasting treatment, the gas is little adsorbed, so that the gas releasing property is restrained when using the ceramic base material as an interior wall material of the process container, and a ceramic member of high reliability can be offered. As the ceramics, alumina preferably enables a best ideal etching.

In the first to fourth aspects of the invention, a reason why structures having particular shapes as mentioned above are generated is not always definite, but it is assumed that particular structures depend on the following reasons or phenomena.

First, polycrystal ceramics (sintered substance) have fine structures of grains connected and unified one another via grain boundaries, and in comparison with the interiors of the crystal grains, parts around the grain boundary having the more existing amount of impurities segregating in boundaries among the crystal grains are in general ready for effecting corrosion. However, although reasons or actions are not cleared, if the purity of components composing the polycrystal ceramic is 95 wt % or higher, more preferably 99 wt % or higher, the difference is small between the corroding rate of the grain itself and the corroding rate of the grain boundaries, and the corrosions advance almost simultaneously.

Second, the above mentioned corrosions advance at little difference between the grain itself and the grain boundaries but almost simultaneously. Further, if the etching conditions are determined more severely as using the heated and pressurized etchant, this phenomenon becomes more remarkable.

Third, when the ceramic grain is corroded by reaction with the etchant, reacted products are created, and when these products have the amount exceeding the solubility in the etchant, they are precipitated as fine crystals in the surface of the ceramic crystal grain. Since the crystal of the reacted product interrupts corrosion of the ceramic grain by the etchant, the ceramic crystal grain is formed on the surface with protruding parts having apexes of precipitated parts of the reacted products.

For precipitating the reacted products of the ceramic and the acid etchant, the density of the acid etchant is an important factor. If the density of the etchant is low, the reacted product is dissolved in the etchant and is difficult to precipitate as crystal. A lower limit of the etchant can be determined in consideration of a reaction amount, a reaction rate, ratio in the amount of the ceramic and the etchant, or an etching temperature, but practically, since the etching site and the precipitating site of the reacted product are very near, the etchant is uneven in the density, so that the precipitation of the reacted product is possible to occur even at a lower density of the etchant than that of a theoretical calculation. Therefore, it is difficult to determine sooner the density of the etchant, and it is practically sufficient to determine a density where the crystal of the reacted product is precipitated experimentally. For example, in case the ceramic is alumina and the etchant is the sulfuric acid, the density is preferably 90 wt % or higher, more preferably 95 wt %. For example, in case the ceramic is alumina and the etchant is the phosphoric acid, the density is preferably 80 wt % or higher, more preferably 85 wt %. It is noted that if the reacted product or its compound is previously dissolved or mixed in the etchant, the object may be accomplished even at a lower density.

Fourth, for forming protrusions, it is also an important factor that the corrosion rate along length of the protrusion is faster than that along diameter. The ceramic crystals are generally varied in the corrosion rates depending on crystal orientations, and in particular, under the severe corrosion conditions as mentioned in the above "Second" paragraph, the protruding part is formed directing to the orientation of faster corrosion rate. The surface of the ceramic (base material) is composed with many crystal grains, and the respective crystal grains exist with different orientations. Therefore, the protrusions formed on the crystal surface direct to respective orientations.

Fifth, for forming the protrusions, the surface condition of the ceramic base material may become an important factor governing the protruding forms. That is, the degree of the corrosion rate governs the protruding forms, and whether the surface of the ceramic base material is ready for corrosion or less to effect corrosion, presents different forms even if the corrosion is performed with the same etchant, at the same temperature and under the same pressurizing condition.

For example, the surface of the ceramic subjected to a grinding process has fine processing flaws facile to be corroded, and is easy to present relatively pillar-like protruding forms. In contrast, an as-sintered ceramic surface is difficult to effect corrosion in comparison with the processed surface, and is easy to show forms as moderate mountains.

EXAMPLE 1

Explanation will be made to an example referring to an electron microscopic photograph in place of a drawing.

Alumina ceramic plates of purity: 99.5 wt %, bulky density: 3.97 g/cm$^3$, and average grain diameter: 40 $\mu$m are prepared, while the sulfuric acid of density: 96 wt % is prepared as the acid etchant. Next, the alumina ceramic plates are immersed in the acid etchant and carried out with treatments for predetermined time and at predetermined pressure so as to form protrusions on the crystal grain which are in diameter smaller than the crystal grain. For carrying out the etchant process, as shown in Table 1, the temperature of the etchant is maintained 50 to 230° C., the etchant is pressurized 0.1 to 10 Mpa, and the etching time is determined in consideration of the temperature and the pressure of the etchant.

TABLE 1

| Surfaces of ceramic bases | Etchant temperatures (° C.) | Etchant pressure (Mpa) | Etching time (h) | Forming effect (*) of protruded parts |
|---|---|---|---|---|
| Ground face | 50 | 10 | 50 | Δ |
| Ground face | 100 | 0.1 | 20 | Δ |
| Ground face | 100 | 0.2 | 20 | ◯ |
| Ground face | 100 | 3 | 10 | ◯ |
| Ground face | 100 | 10 | 10 | ◯ |
| Ground face | 200 | 0.1 | 10 | ◯ |
| Ground face | 200 | 0.2 | 10 | ◯ |

TABLE 1-continued

| Surfaces of ceramic bases | Etchant temperatures (° C.) | Etchant pressure (Mpa) | Etching time (h) | Forming effect (*) of protruded parts |
|---|---|---|---|---|
| Ground face | 200 | 1 | 10 | ◯ |
| Ground face | 200 | 3 | 10 | ◯ |
| Ground face | 230 | 0.1 | 10 | ◯ |
| Ground face | 230 | 0.2 | 10 | ◯ |
| Ground face | 230 | 1 | 10 | ◯ |
| Sintered face | 230 | 1 | 10 | ◯ |
| Ground face | 230 | 3 | 10 | ◯ |

* ∆: Small effects
◯: Large effects

When the surfaces of the alumina ceramic plates subjected to the etching process are observed with the electron microscope and evaluated, there are, under the inventive conditions, the ceramics having the plurality of protrusions smaller than the crystal grains on the surface of the crystal grains composing the surfaces of the ceramic base material.

Figure 2:
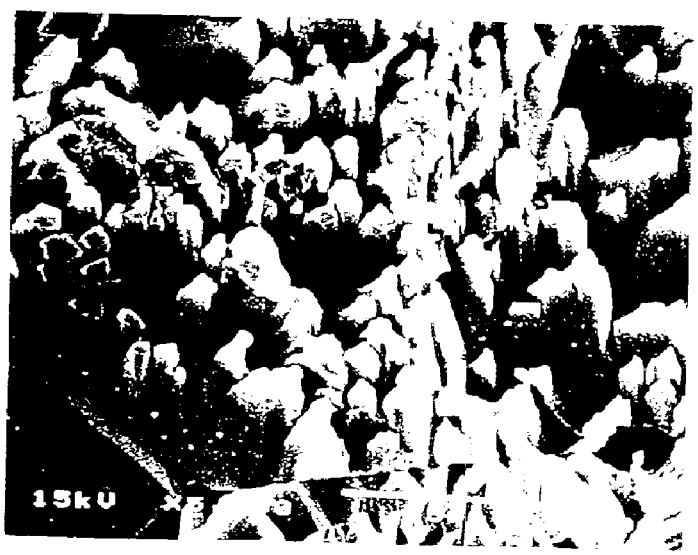
FIG. 2 shows an electron microscopic photograph of the ceramic member relating to the example 1 of the invention, which is produced of the ceramic base material of the ground surface, taking a photograph at a different magnification from that of FIG. 1.
Figure 3:
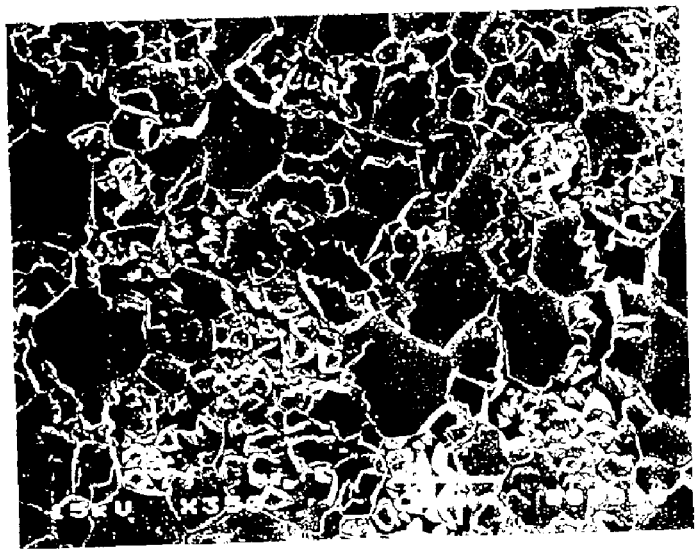
FIG. 3 shows an electron microscopic photograph of the ceramic member relating to the example 1 of the invention, which is produced of the ceramic base material of the sintered surface.
Figure 4:
FIG. 4 shows an electron microscopic photograph of the ceramic member relating to the example 1 of the invention, which is produced of the ceramic base material of the sintered surface, taking a photograph at a different magnification from that of FIG. 1.

The electron microscopic photographs are shown in FIGS. 1, 2, 3 and 4. FIGS. 1 and 2 show the ground surfaces of the alumina ceramics treated with the etchant at 230° C. and at pressure of 1 Mpa. FIG. 1 is of 1000 magnification and FIG. 2 is of 5000 magnification. Further FIGS. 3 and 4 show the alumina ceramics treated with the etchant at 230° C. and at pressure of 1 Mpa. FIG. 3 is of 350 magnification and FIG. 4 is of 1000 magnification. Although the forms are respectively somewhat different, the major parts of the crystal grains have the plurality of protrusions on the surfaces, and the protrusion is structurally integral with the crystal grain of the base material.

The process chamber of the plasma CVD apparatus is composed with the alumina ceramic having fine protrusions on the surface, and when evaluating influences (releasing the gas) to the process chamber system when forming the film and conditions of the film forming grains adhering and getting out, the normal operation is possible. In other words, no influence is present to the film forming condition, neither releasing nor peeling of the film forming grains accidentally adhered to the walls of the process chamber are recognized, and the excellent anchoring effect and the maintenance of the normal film forming are confirmed.

In the example, the sulfuric acid is used as the etchant, and the phosphoric acid and its water solution are also sufficient. Namely, if the temperature, the pressure of the etchant and the etching time are appropriately selected, taking the density and the etching ability into consideration, it is possible to provide the alumina ceramic having the plural protrusions smaller in diameter than the crystal grain. In case of using phosphoric-acid water solution, such an alumina ceramic can be obtained by preparing phosphoric-acid water solution of its acid density being not less than 95 wt % in which an alumina ceramic immersed for about ten hours under 100° C. temperature.

According to the first to fourth aspects of the invention, the surface of the ceramic base material takes the structure having many fine protrusions directing to various orientations. Films of heterogeneous substances once adhered to such surfaces are kept less to get out owing to the combination with the protrusions. Accordingly, if employing the inventive ceramic as the wall of the process chamber of the film forming container, it is possible to perform the film forming process of good yield and high reliability.

According to the second to the fourth aspects of the invention, it is possible to offer the ceramic structural members for the film forming apparatus not only having the excellent anchoring effect but also restraining the gas releasing property and enabling the treatment of high reliability.

Next, the first to ninth aspects of the invention have been established on the basis of the following consideration and finding.

First, polycrystal ceramics (sintered substance) have fine structures of grains connected and unified one another via grain boundaries, and in comparison with the crystal grains (the interiors), parts around the grain boundary having the more existing amount of impurities segregating in boundaries among the crystal grains are in general ready for effecting corrosion. However, although reasons or actions are not cleared, if the purity of components composing the polycrystal ceramic is 95 wt % or higher, more preferably 99 wt % or higher, the difference is small between the corroding rate of the grain itself and the corroding rate of the grain boundaries, and the corrosions advance almost simultaneously. The surface layer (for example around 80 µm depth) has rugged structure including fine pores, which have diameters of 0.5 to 50 times of average grain diameters of polycrystal ceramics, some of the fine pores have large diameter portions in the depth direction.

Second, the above mentioned corrosions advance at little difference between the grain itself and the grain boundaries but almost simultaneously. The corrosion of the rugged structure including the fine pores with large diameter portions in the depth direction of the surface layer can be more easily accomplished, if the etching conditions are determined more severely as using the heated etchant and the pressurized etchant, or the heated-pressurized etchant. The corrosion of the rugged structure including the fine pores with large diameter portions in the depth direction, has an opening diameter of 0.5 to 50 times of the average diameter of the crystal grain composing the polycrystal ceramics, and this range is more effective and economical. Further, the fine pore making the rugged structure in the surface layer has a structure where the large diameter portion exists in the depth direction, and is often an anchoring shape connecting apexes one another.

Third, the rugged structure has the diameter of 0.5 to 50 times of average grain diameters of the crystal grain constituting the sintered ceramic and contains fine pores with large diameter portions in the depth direction. The rugged structure is substantially the only surface layer, and the basic part thereof is so fine that a gas adsorbing function and a gas releasing function may be ignored. Therefore, the rugged structure is useful as a composing material of a vacuum channel, a basic material for a compound body (laminated body) having a rugged face (anchoring effect) to be connected including fine pores, or a basic material for bio part member.

The rugged structure including fine pores with large diameter portions in the depth direction may be produced, in a process of making the sintered ceramics, by providing the ceramic layer containing grains of flammable substance (such as resin grains) on, e.g., the surface of a ceramic-made body enabling to be fine, and after drying, by sintering to effect porosity. However, it is very difficult to provide a thin layer of the rugged structure at equal depth from the surface as the invention does, pores are clogged during sintering or grains easily become round. Thus, the characteristics of the invention cannot be fully satisfied.

In the first to ninth aspects of the invention, for the dense ceramics (the base material), in response to usage, are suitably selected from alumina based, alumina-silica based, yttrium aluminum garnet based, aluminum nitride based, silicon nitride based, yttria based, zirconia based, and calcium phosphate based ceramics. For example, in a case of a member demanded to have plasma resistance, there are listed alumina based, yttrium aluminum garnet based, and yttria based ceramics, in cases of a composing member or a compound (laminated) composing member demanded to have heat resistance, there are listed aluminum nitride based, silicon nitride based, and zirconia based ceramics, and for living bodies, there are listed alumina based, zirconia based, alumina-zirconia based, and calcium phosphate based ceramics. These dense base materials have the purity of 95 wt % or higher, preferably 99 wt % or higher, and the density of 90% or higher of the theoretical density, preferably 95% or higher.

In the fifth to ninth aspects of the invention, the ceramic base material base material is carried out on the surface with the corrosion treatment in the acid etchant for providing the rugged structure having the diameter of 0.5 to 50 times of average grain diameters of the crystal grain constituting the sintered ceramic and contains fine pores with large diameter portions in the depth direction. For the ceramic base material base material, such dense ceramics are selected which have not only the purity of 95 wt % or higher but also the density of more than 90% of the theoretical density. In short, unless the dense ceramic base material (raw material) has the purity of 95 wt % or higher, more preferably 99 wt % or higher and the density of more than 90% of the theoretical density, when the surface is carried out with the corrosion treatment in the acid etchant, it is not possible to made the rugged structure containing fine pores with large diameter parts in the desired depth.

In the fifth to ninth aspects of the invention, for carrying out the etching process, if the acid etchant is heated and/or pressurized 0.2 MPa or higher, the corrosion treatment for making the surface layer the rugged structure including the fine pores with large diameter parts in the depth direction is progressed more easily and exactly, and it is possible to mass-productively offer the ceramic member having the rugged structure on the surface.

Herein, the acid etchant is in general the water solution containing the sulfuric acid or the phosphoric acid. An upper limit of a heating temperature of the acid etchant is determined within a range of not generating a thermal decomposition of the sulfuric acid.

In the fifth to ninth aspects of the invention, if the ceramic member is performed on the surface with the corrosion treatment in the acid etchant for making rugged thereon and is heat-treated at temperatures of ⅔ or higher of the melting point of the ceramics, the fine pores with large diameter portions in the depth forming the rugged structure in the surface are regulated more smoothly and continuously. That is, sharp portions of the rugged structure of the fine pores formed by corrosion of the acid etching are regulated by re-crystallization, so that heterogeneous grains or a bonding agent are easy to enter and easily carried, thereby to present excellent adherence or the anchoring effect.

In the first to fourth aspects of the invention, the base material (matrix) is fine and it has the surface layer formed with the rugged structure having the diameter of 0.5 to 50 times of average grain diameters with large diameter portions in the depth direction. In other words, the surface layer is composed with not only simple and one orientation pores but also complicated, curved and anchoring pores, so that grains once adhered to such surface layers keep conditions of not easily releasing or scattering in company with the anchoring action and effect. Accordingly, it is possible to avoid inconvenience or bad conditions caused by partially releasing or scattering film forming components adhered and piled to the interior wall of the treatment chamber in the process such as a vapor deposition or a spattering, and as the gas releasing property is restrained, it is possible to process products of high reliability with good yield.

In the fifth to ninth aspects of the invention, it is possible not only to avoid inconvenience or bad conditions caused by partially releasing or scattering the adhered and piled film forming components, but also to mass-productively produce the ceramic member enabling to process into processed products of high reliability by restraining the gas releasing property.

In the ceramic member according to the invention, although the surface layer is rugged (may be said as porosity depending on degree), its framework or skeletal part is fine similarly to the base material, and strength as well as corrosion resistance are more excellent than those manufactured by other instruments. The depth from the surface of making ruggedness is arbitrarily determined, and if determining to be around 10 to 1000 $\mu$m or a degree as may be said porosity, effects are especially large. In particular, the degree between 50 $\mu$m and 300 $\mu$m is desirable for semiconductors. Herein, with respect to the structure in cross section, if the ruggedness is so made that the pores are dotted until a deeper depth than the depth of the layer of rugged structure formed in the surface, the anchoring effect is made more secured. Further, the average grain diameter of the ceramic base material is preferably 5 to 100 $\mu$m, more preferably 50 $\mu$m or lower. This is because in case of the average diameter being too small, appropriate rugged surface can not be made, while in case of the average diameter being too large, its durability becomes lower.

Particularly, as alumina materials to be used to a semi conductor producing apparatus, those are desirable which have high purity and comparatively large average grain diameter.

The average grain diameters are preferably 10 to 50 $\mu$m, more preferably 10 to 45 $\mu$m. The purity is preferably 99.5% or higher, particularly preferably 99.9% or higher. As such preferable alumina, there are materials having transparency. The transparent alumina has sufficient strength after an acid-treatment, and is suited for providing a rugged anchoring effect.

Explanation will be made to an example referring to an electron microscopic photograph in place of a drawing.

EXAMPLE 2

Alumina ceramic plates of purity: 99.7 wt %, bulky density: 3.97 g/cm$^3$, and average grain diameter: 40 $\mu$m are prepared, while the water solution of sulfuric acid of density: 25 wt % is prepared as the acid etchant. Next, the alumina ceramic plates are immersed in the acid etchant and carried out with an acid etching process for predetermined time so as to make the surface layer (within about 80 $\mu$m) rugged of 0.5 to 10 times diameter of the average grain diameter and including the fine pores with large diameter portions in the depth direction. For carrying out the etching process, as shown in Table 2, the temperature of the etchant is maintained 25 to 230° C., the acid etchant is pressurized 0.1 to 10 MPa, and the etching time is determined in consideration of the temperature and the pressure of the etchant.

TABLE 2

| Etchant temperatures (° C.) | Etchant pressure (MPa) | Etching time (h) | Results |
| --- | --- | --- | --- |
| 25 (Room temp.) | 10 | 100 | Δ |
| 50 | 10 | 50 | Δ |
| 100 | 0.1 | 50 | Δ |
| 100 | 0.2 | 50 | ◯ |
| 100 | 2 | 30 | ◯ |
| 100 | 10 | 10 | ◯ |
| 150 | 0.1 | 50 | Δ |
| 150 | 0.2 | 50 | ◯ |
| 150 | 1 | 30 | ◯ |
| 150 | 3 | 20 | ◯ |
| 150 | 10 | 10 | ◯ |
| 200 | 0.1 | 50 | Δ |
| 200 | 0.2 | 50 | ◯ |
| 200 | 1 | 30 | ◯ |
| 200 | 3 | 20 | ◯ |
| 230 | 0.1 | 50 | Δ |
| 230 | 0.2 | 50 | ◯ |
| 230 | 1 | 30 | ◯ |
| 230 | 3 | 20 | ◯ |

Δ: Small effect of poring
◯: Large effects of poring

Figure 5:
FIG. 5 shows an electron microscopic photograph of the ceramic member of the rugged surface (porosity) according to the example 2, showing a cross sectional view of the rugged structure including the fine pores in the surface layer.
Figure 6:
FIG. 6 shows an electron microscopic photograph of the ceramic member of the rugged surface (porosity) according to the example 2, showing a plan view of the rugged structure including the fine pores in the surface layer.
Figure 7:
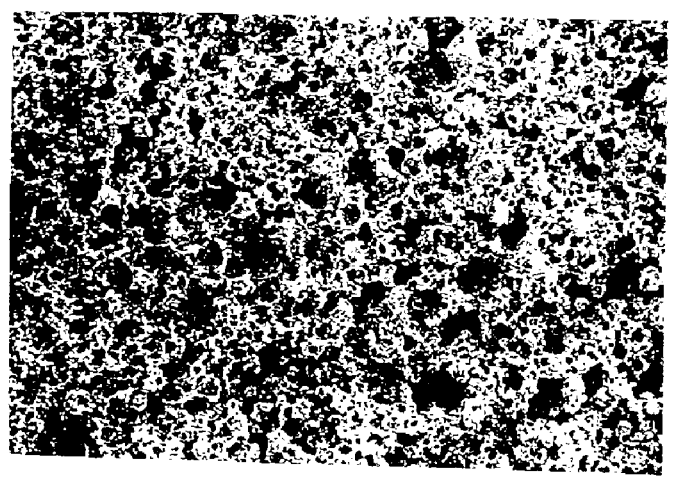
FIG. 7 shows an electron microscopic photograph of the ceramic member of the rugged surface (porosity) according to the example 3, showing a plan view of the rugged structure including the fine pores in the surface layer.
Figure 8:
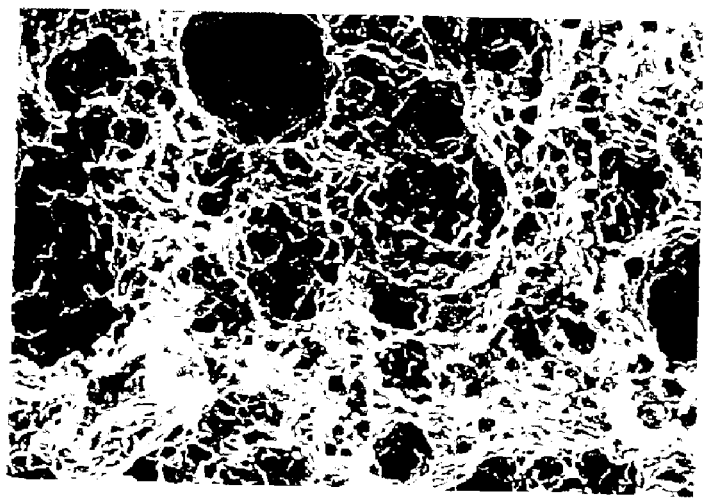
FIG. 8 shows an electron microscopic photograph of the ceramic member of the rugged surface (porosity) according to the example 3, showing a plan view of the rugged structure including the fine pores in the surface layer at a different magnification from that of FIG. 7.

When the surfaces of the alumina ceramic plates subjected to the etching process are observed with the electron microscope and evaluated, each case is such a ceramic member where the interior side (substrate) has the initial fine density, the layer of around 80 μm in the surface is 0.5 to 10 times of the average grain diameter, and the rugged structure is made including the fine pores with large diameter portions in the depth direction. For example, the surface conditions are respectively shown in FIG. 5 in the cross section and in FIG. 6 in plan. FIGS. 5 and 6 are the cases of the etchant temperature being 230° C. and the etchant pressure being 1 MPa where the surface layer is the complicated rugged structure having the diameter of 0.5 to 10 times of the average grain diameter and including the fine pores with large diameter portions in the depth direction.

The process chamber of the plasma CVD apparatus is composed with the alumina ceramic making the surface thereof the complicated rugged structure including the fine pores with large diameter portions in the depth direction, and when evaluating influences (releasing the gas) to the process chamber system when forming the film and conditions of the film forming grains adhering and getting out, the normal operation is possible. In other words, no influence is present to the film forming condition, neither releasing nor peeling of the film forming grains accidentally adhered to the walls of the process chamber are recognized, and the excellent anchoring effect and the maintenance of the normal film forming are confirmed.

In a case where the complicated rugged structure of alumina ceramics including the fine pores with large diameter portions in the depth direction is made the surface thereof compound by pasting a metal or resin sheet via an adhesive agent, otherwise also in a case where the rugged structure of alumina ceramics is laminated integrally with the resin sheet having fusing property, the rugged surface exhibits a firm unification. In short, the rugged surface of alumina ceramic is confirmed of the excellent anchoring effect for producing compound or laminated structures.

In the example, the water solution of sulfuric acid is used as the etchant, and the water solutions of phosphoric acid or hydrofluoric acid are also sufficient. Namely, if the etchant temperature, the pressure thereto and the etching time are appropriately selected, taking the density and the etching ability into consideration, it is possible to provide the alumina ceramic having the plural protrusions smaller in diameter than the crystal grain.

Figure 9:
FIG. 9 shows an electron microscopic photograph of the ceramic member of the rugged surface (porosity) according to the example 3, showing an enlarged perspective view of grains forming the rugged structure.

Alumina garnet plates of purity: 97 wt %, bulky density: 4.32 g/cm$^3$, and average grain diameter: 5 μm are prepared, while the water solution of sulfuric acid of density: 25 wt % is prepared as the acid etchant. Next, the yttrium aluminum garnet plates are immersed in the acid etchant kept 230° C., and carried out with an etching process for 3 hours so as to make the surface layer (within about 80 μm) rugged of 0.5 to 10 times diameter of the average grain diameter and including the fine pores with large diameter portions in the depth direction. FIGS. 3 and 4 show, in plan and at different magnification, the rugged surface layers including the fine pores with large diameter portions in the depth direction of the yttrium aluminum garnet plates. FIG. 9 shows by more enlarging the condition (situation) within the rugged structure.

The complicated rugged structure of the yttrium aluminum garnet plates including the fine pores with large diameter portions in the depth direction is recognized of the similar action and effect in the same using embodiment as in the Example 1. For example, in a case where the rugged structure is made on the surface compound by pasting the metal sheet or resin sheet via the adhesive agent, otherwise also in a case where the rugged structure of alumina ceramics is provided on the surface with oxide or fluoride layers having the fusing property to be laminated integrally, the rugged surface exhibits a firm unification. In short, the rugged surface of alumina ceramics is confirmed of the excellent anchoring effect for producing compound or laminated structures.

EXAMPLE 3

Figure 10:
FIG. 10 shows an electron microscopic photograph of the ceramic member of the rugged surface (porosity) according to the example 4, showing a plan view of the rugged structure including the fine pores in the surface layer.
Figure 11:
FIG. 11 shows an electron microscopic photograph of the ceramic member of the rugged surface (porosity) according to the example 4, showing a plan view of the rugged structure including the fine pores in the surface layer at a different magnification from that of FIG. 10.

The alumina plates obtained in the Example 1 are heat-treated at 1800° C. for 3 hours in a hydrogen atmosphere. The results are shown in FIGS. 10 and 11. FIG. 11 is the enlarged view of FIG. 10.

As apparently from FIGS. 10 and 11, by the heating treatment at high temperatures in the hydrogen atmosphere, crystal boundary of the alumina plate is round as keeping crystalline. Also, this structure is confirmed presenting the excellent anchoring effect.

The invention is not limited to the above mentioned examples, and so far as not getting out from the subject matter of the invention, various modifications may be adopted. For example, in case the dense ceramic base material is those sintered substances of yttria, zirconia, silicon nitride, aluminum nitride, or calcium phosphate (tricalcium phosphate, tetracalcium phosphate or hydroxyl apatite), similar actions and effects are available.

Further, broad application fields may be enumerated as the using examples. For instance, by making the surface layer of the dense ceramic base material firmly rugged (porosity), it may be employed as parts of living bodies such as artificial bones. That is, if the base material is made of alumina based, zirconia based, alumina-zirconia based, or calcium phosphate based ceramics, thereby making the surface rugged, the unification with the living body may be more accelerated. Further, it is possible to coat a catalyst on the rugged surface or arrange a coating layer having other (heterogeneous) properties thereon.

According to the first to fourth aspects of the invention, the base material (matrix) is fine and it has the structure formed with large diameter portions in the depth direction. In other words, the surface layer is composed with the complicated, curved and anchoring pores, so that grains once adhered to such surface layers exhibit the excellent anchoring effect in company with the anchoring action and effect, and it is possible to completely avoid and cancel inconvenience or bad conditions of escaping or exfoliating adhered grains or formed films. As the gas releasing property is restrained, when using as the composing member of the interior wall of the treatment chamber, for example, in the process such as a vapor deposition or a spattering, it is possible to process products of high reliability with good yield.

According to the fifth to ninth aspects of the invention, it is possible to mass-productively produce the ceramic structural member at good yield, enabling to process products of high reliability by not only having the excellent anchoring effect but also restraining the gas releasing property.

The 14th to 19th aspects of the invention have been established on the basis of the following considerations and findings.

First, polycrystal ceramics (sintered substance) have fine structures of grains connected and unified one another via grain boundaries, and in comparison with the crystal grains (the interiors), parts around the grain boundary having the more existing amount of impurities segregating in boundaries among the crystal grains are in general ready for effecting corrosion. However, although reasons or actions are not cleared, if the purity of components composing the sintered substance is 95 wt % or higher, more preferably 99 wt % or higher and the average grain diameters of the sintered substances are 10 to 70 $\mu$m, the difference is small between the corroding rate of the grain itself owing to the acid etching liquid and the corroding rate of the grain boundaries, and the corrosions advance almost simultaneously.

The surface layer (within 5 times of the average grain diameters) is corroded by the rugged structure including fine pores of an average grain size order having large diameter portions in the depth direction, in other words, the rugged structure being seemingly observed such that some of the grains do not exist.

By the way, the shape "being seemingly observed such that some of the grains do not exist" only means that an etched shape looks like so, and the actual falling of the grain is mainly caused by simultaneously etching the grain boundary and the grain itself. In addition, in the acid etching process, the micro cracks formed on the surface are removed. The average grain diameters are within the range of 10 to 70 $\mu$m, preferably 10 to 50 $\mu$m, more preferably 10 to 45 $\mu$m, and the material quality is desirably a translucent alumina ceramics.

Second, the above mentioned corrosions advance at little difference between the crystal grain itself and the grain boundaries but almost simultaneously. The corrosion of the rugged structure having the large diameter portions in the depth direction of the surface layer, in other words, the ruggedness seeming as the grains falling from the surface, is appropriately performed by determining the acid etchant temperature, taking the average grain diameters of the sintered substance itself into consideration. In short, the above performance is carried out by the acid etchant at room temperatures or heated containing the sulfuric or phosphoric acid, irrespective of the material quality and the average grain diameters of the sintered substance.

Herein, in the case of the average grain diameters being around 10 to 20 $\mu$m, it is desirable to use the sulfuric acid based etchant or the phosphoric acid based etchant at the room or low temperatures, and in the case of the average grain diameters being 20 to 70 $\mu$m, it is desirable to use the sulfuric acid based etchant heated at 100 to 230° C. or the phosphoric acid based etchant heated at 50 to 120° C. Incidentally, the ruggedness and the corrosion for removing the pulverized layer are within 5 times of the average grain diameters composing the polycrystal ceramics (sintered substance). The shape forming the rugged structure in the surface layer which seems as the grains partially fall, is in general the structure where the large diameter portion can exist in the depth direction, and may have often anchoring formation of connecting the ruggedness or the corrosions at front end sides thereof.

Third, the rugged structure having large diameter portions in the depth direction is substantially the only surface layer, and the basic part thereof is so fine that a gas adsorbing function and a gas releasing function may be almost ignored. Therefore, the rugged structure is useful as a composing material of a vacuum channel, a basic material for a compound body (laminated body) having a rugged face (anchoring effect) to be connected including fine pores, or a basic material for bio members together with improvement and heightening of Vickers hardness.

Fourth, as to the etching of the sintered ceramics by the plasma, it trends to selectively progress around the surface pulverized layer (micro cracks). In short, if the surface of the sintered ceramics is exposed to the plasma, it is slowly etched, and then the etching is at first effected selectively toward the micro cracks formed on the surface. The micro cracks are spread in response to increase of the cleaning number and accelerates problems about particles. Accordingly, it is made important in view of durability to remove the micro crack layer created by processing the surface of the sintered ceramics.

The dense ceramics (the base material) are suitably selected in response to usage from, for example, alumina, alumina-silica based, yttrium aluminum garnet based, aluminum nitride based, silicon nitride based, yttria based, and zirconia based substances. In the case of members demanded to have the plasma resistance, there are listed alumina based, yttrium aluminum garnet based, and yttria based ceramics, in the case of composing members or compound (laminated) composing members demanded to have the heat resistance, there are listed aluminum nitride based, silicon nitride based, and zirconia based ceramics, and for living bodies, there are listed alumina, zirconia, alumina-zirconia, and calcium phosphate based ceramics. These dense ceramic base materials have the purity of 95 wt % or higher, preferably 99 wt % or higher. In particular, in the case of the translucent alumina, it is preferable that the purity is 99.9 wt % or higher, the average grain diameter is 10 to 50 $\mu$m, the rugged depth by etching is 1 to 3 times of the average grain diameter.

Further, the ceramic base material which is carried out on the surface with the corrosion treatment in the acid etchant for providing the rugged structure having large diameter portions in the depth direction, is selected from such dense ceramics which have not only the purity of 95 wt % or higher but also the average diameters of 10 to 70 $\mu$m. In short, unless making the dense base material (blank material) of the ceramics having the purity being 95 wt % or higher, more preferably 99 wt % or higher and the average grain diameters of the sintered substances are 10 to 70 $\mu$m, preferably 10 to 50 $\mu$m, more preferably 10 to 45 $\mu$m, when immersing to treat the ceramics on the surface in the acid etchant, it is impossible to provide the rugged structure which has removed the pulverized layer and seems as grains partially fall. For providing the rugged structure which seems as grains partially fall, the grain diameters are preferably 0.5 to 10 times of the average grain diameters, more preferably 1.0 to 5 times.

For carrying out the etching process, if the acid etchant is heated and/or pressurized 0.2 MPa or higher, the rugged structure as grains partially falling from the surface is maintained, while the corrosion treatment for removing the pulverized layer (micro cracks) from the processed surface is progressed more easily and exactly, and it is possible to mass-productively offer the ceramic member having the rugged structure on the surface. Herein, the acid etchant is in general the water solution containing the sulfuric acid or the phosphoric acid. An upper limit of a heating temperature of the acid etchant is determined within a range of not generating a thermal decomposition of the sulfuric acid.

If the ceramic member is performed on the surface with the corrosion treatment in the acid etchant for making rugged thereon and is heat-treated at temperatures of ⅔ or higher of the melting point of the ceramics, the grains having the rugged surface structure are regulated more smoothly and continuously. That is, sharp portions of the rugged structure seeming as grains falling formed by corrosion of the acid etching are regulated by re-crystallization, so that heterogeneous grains or a bonding agent are easy to enter and easily carried, thereby to present excellent adherence or the anchoring effect.

Further, the base material (matrix) is fine and the surface layer has the rugged structure seeming as grains partially falling and has no substantial existence of micro cracks. In other words, the surface layer is composed with not only simple and one orientation pores but also complicated, curved and anchoring pores, so that grains once adhered to such surface layers keep conditions of not easily releasing or scattering in company with the anchoring action and effect. As the damaged layers as micro cracks are removed from the surface, any selective etching by the plasma is controlled, not only the plasma resistance itself is improved but also decrease of the mechanical strength is prevented.

Therefore, in instruments as evaporation or spattering, it is possible to avoid inconvenience or bad conditions caused by partially releasing or scattering the film forming components adhered and piled on the wall of a processing chamber. In addition, as the gas releasing property is restrained, it is possible to process into processed products of high reliability usefully in maintenance and good yield.

Furthermore, it is possible not only to avoid inconvenience or bad conditions caused by partially releasing or scattering the adhered and piled film forming components, but also to mass-productively produce the ceramic member enabling to process into processed products of high reliability by restraining the gas releasing property.

In the ceramic member according to the invention, although the surface layer is rugged (may be said as porosity depending on degree), its framework or skeletal part is fine similarly to the base material, and strength as well as corrosion resistance are more excellent than those manufactured by other instruments. The translucent alumina having the purity being 99.9 wt % or higher, the average grain diameters being 10 to 50 μm, the surface etched 1 to 3 times of the average diameters and having removed micro cracks is excellent in strength, large in the anchoring effect, naught in peeling of the piled film, and very suitable for processing the semi conductor.

Explanation will be made to the fifth example referring to an electron microscopic photograph schematically showing the cross sectional views of the alumina ceramic sheet.

Figure 12:
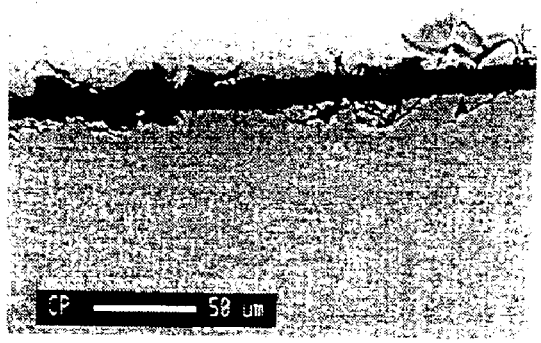
FIG. 12A and FIG. 12B are microphotographs showing the cross sectional structures of the alumina ceramic plates concerned with different comparative examples.
FIG. 12C is a microphotographs showing the cross sectional structure of the alumina ceramic plates concerned with the Example 5.
Figure 12:
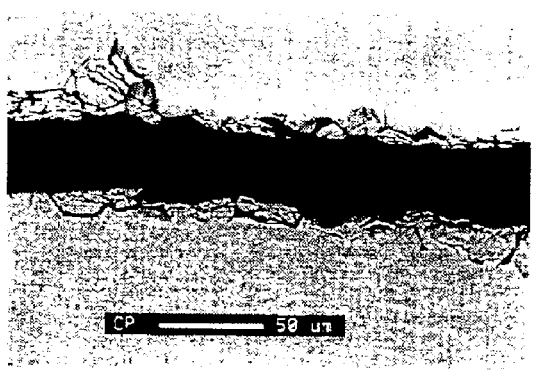
Figure 12:
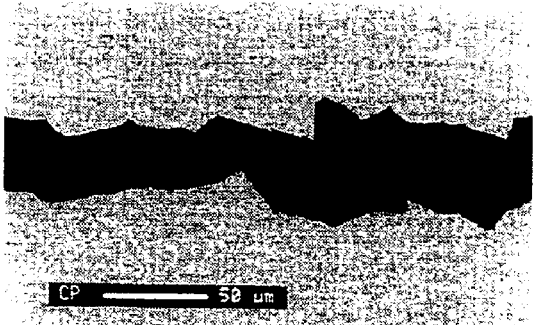

A plurality of alumina ceramic sheets (sintered alumina) of purity: 99.9 wt % and average grain diameters: 25 μm were prepared, and each of them was subjected to the surface process by the grinder. When one sheet of the ground alumina ceramics was cut and imaged at the cross section through the electron micro scope, the surface was formed with a fine pulverized layer as shown in FIG. 12A. Further, when the above mentioned ground alumina ceramics was carried out on the surface with the sand blast of SiC particle, cut and imaged at the cross section through the electron micro scope, the surface was confirmed as the pulverized layer largely enlarged as shown in FIG. 12B.

In addition, when the above mentioned ground alumina ceramic sheet was immersed in the water solution of the sulfuric acid of the 25 wt % density heated and kept at 230° C. for 16 hours under pressure of around 3 MPa (30 atm), subjected on the surface to the etching process, cut and imaged at the cross section through the electron micro scope, the surface had the fine rugged structure without the pulverized layer. Namely, it was confirmed that the surface had the fine rugged structure, while the pulverized layer (micro cracks) was removed.

Figure 13:
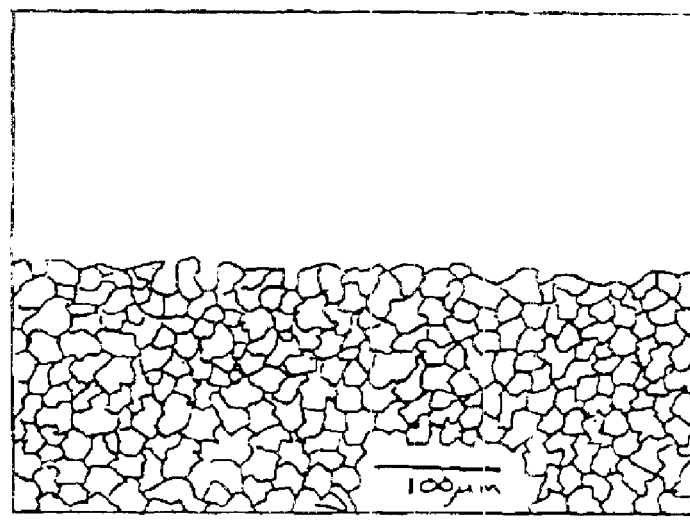
FIG. 13A and FIG. 13B are the cross sectional views schematically showing the cross sectional structures of the alumina ceramic plate surfaces of different average grain diameters concerned with the Example 6.
Figure 13:
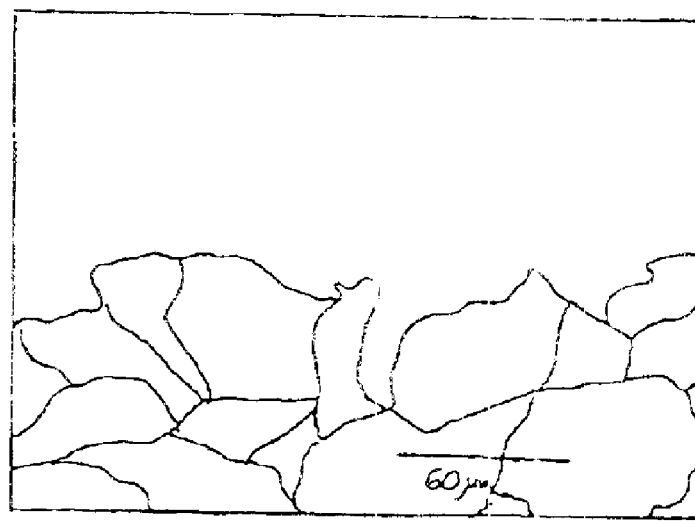
Figure 14:
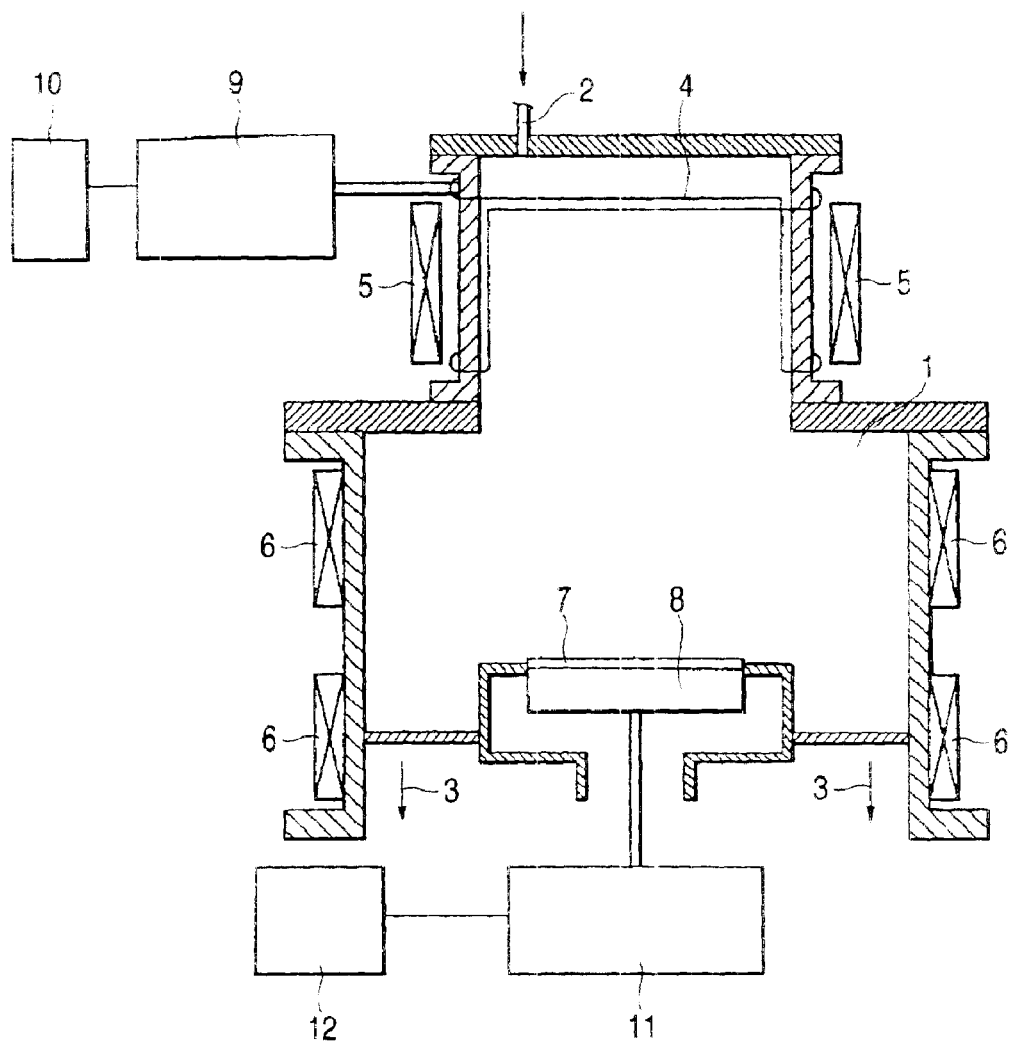
FIG. 14 shows a cross sectional view of a schematically structured example of the plasma etching apparatus.

In place of the alumina ceramic sheets, the translucent alumina ceramic sheets (the sintered alumina) of the average grain diameters of 20 to 60 μm were carried out with the grinding treatment and were immersed in the water solution of the sulfuric acid of the 25 wt % density heated and kept at 230° C. for 16 hours under pressure of around 3 MPa (30 atm), subjected on the surfaces to the etching process. After the etching process, the alumina ceramic sheets were cut and the cross sections imaged through the electron micro scope (EPMA) were schematically shown in FIGS. 13A and 13B. FIG. 13A shows the translucent alumina ceramic sheet of the average grain diameter being 20 μm, and FIG. 13B shows the translucent alumina ceramic sheet of the average grain diameter being 60 μm.

More specifical examples will be explained. Herein, the respective alumina ceramic sheets were prepared, having the average grain diameters: less than 10 μm (Comparative Example A), 10 to 20 μm (Example A), 20 to 70 μm (Example B), and more than 70 μm (Comparative Example B). The alumina ceramic sheets had each the purity of 95 wt %. On the other hand, the water solution of the sulfuric acid of the 25 wt % density and the water solution of the phosphoric acid of the 96 wt % density were prepared as the etchants.

Subsequently, the respective alumina ceramic sheets were immersed in the acid etchant at room temperature (25° C.) or heated (in the case of water solution of the sulfuric acid, 200° C. and in the case of water solution of the phosphoric acid, 100° C.), and performed with the etching process for a predetermined time. For carrying out the etching process, the acid etchant was pressurized 0 to 10 MPa, and the etching time was determined in consideration of the temperature and the pressure of the etchant.

When the surfaces of the alumina ceramic plates subjected to the etching process were observed with the electron microscope and evaluated, conditions on the surface layer (within around 80 μm) of the respective alumina ceramic sheets were as shown in Table 3. By the way, ⊚ under the etching condition is excellent, ○ is good, Δ is somewhat poor, and X is bad.

TABLE 3

| Samples | Acids in etchant | Heating | Etching conditions | Remarks |
|---|---|---|---|---|
| Com. A | Sulfuricacid | Non | X | Deteriorated surface by intergranular corrosion |
|  | Sulfuricacid | Yes | X | Ditto |
|  | Phos-phoric acid | Non | X | Ditto |
|  | Phos-phoric acid | Yes | X | Ditto |
| Ex. A | Sulfuricacid | Non | ○ |  |
|  | Sulfuricacid | Yes | ⊚ |  |
|  | Phos-phoric acid | Non | ○ |  |
|  | Phos-phoric acid | Yes | △ | Good if ≦ 150° C. |
| Ex. B | Sulfuricacid | Non | △ | Etching rate is slow |
|  | Sulfuricacid | Yes | ⊚ |  |
|  | Phos-phoric acid | Non | ○ |  |
|  | Phos-phoric acid | Yes | ⊚ |  |
| Com. B | Sulfuricacid | Non | X | Etching rate is very slow |
|  | Sulfuricacid | Yes | X | Ditto |
|  | Phos-phoric acid | Non | X | Ditto |
|  | Phos-phoric acid | Yes | X | Good if ≦ 150° C. |

Com.: Comparative Examples
Ex.: Examples

In the observation and the evaluation, with respect to each of the Examples, the etching smoothly progressed, and the etching condition was excellent as a whole. That is, the ruggedness having the large diameter portion in the depth direction which seemed as the grains partially fell, was formed to be substantially uniform, and on the surface layer, remainders of the micro cracks were not recognized. On the other hand, in the Comparative Example 1, the surface layer showed conditions ready for peeling owing to the intergranular corrosion. In the Comparative Example 2, the etching slowly progressed and the grain boundary showed the tendency of selective corrosion. In either case, the etching condition was bad and problems were present about the plasma resistance and the particle peeling and separating.

The process chamber of the plasma CVD apparatus was composed with the alumina ceramic sheets, and when evaluating influences (releasing the gas) to the process chamber system when forming the film and conditions of the film forming grains adhering and getting out, the normal operation was possible. In other words, no influence was present to the film forming condition, neither releasing nor peeling of the film forming grains accidentally adhered to the walls of the process chamber were recognized, and the excellent anchoring effect and the maintenance of the normal film forming were confirmed. In company with removal of micro cracks from the surface layer, the alumina ceramic sheet was avoided from the selective etching when plasma-cleaning, and not only the plasma resistance was accelerated, but also high durability was exhibited against thermal strain, and so problems about mechanical damages such as cracks or breakage were largely dissolved.

In a case where the complicated rugged structure of alumina ceramics was made the surface thereof compound by pasting a metal or resin sheet via an adhesive agent, otherwise also in a case where the rugged structure of alumina ceramics is laminated integrally with the resin sheet having fusing property, the rugged surface exhibits a firm unification. In short, the rugged surface of alumina ceramic is confirmed of the excellent anchoring effect for producing compound or laminated structures.

In place of the alumina ceramic sheet, in the above example, yttrium aluminum garnet plates of purity: 95 wt %, and average grain diameter: 15 µm were immersed in the water solution of sulfuric acid of density: 25 wt % kept 230° C. and carried out with an etching process for 3 hours. Also in this case, similar action and effect were recognized in the same using embodiment as the Example 1. For example, in case the rugged structure was made the surface thereof compound by pasting a metal or resin sheet via an adhesive agent, otherwise also in a case the rugged structure of alumina ceramics is laminated integrally with oxides or fluoride having a fusing property, the rugged surface exhibited a firm unification.

The invention is not limited to the above mentioned examples, and so far as not getting out from the subject matter of the invention, various modifications may be adopted. For example, in case the dense ceramic base material is those sintered substances of yttria, zirconia, silicon nitride, aluminum nitride, or calcium phosphate (tricalcium phosphate, tetracalcium phosphate or hydroxyl apatite), similar actions and effects are available. Further, broad application fields may be enumerated as the using examples. For instance, by making the surface layer of the dense ceramic base material firmly rugged (porosity), it may be employed as parts of living bodies such as artificial bones.

According to the invention, the base material (matrix) is fine and the surface layer has the rugged structure seeming as grains partially falling and has the condition of no micro cracks existing. In other words, the surface layer is composed with the complicated, curved and anchoring pores, so that grains once adhered to such surface layers keep conditions of not easily releasing or scattering in company with the anchoring action and effect. So, bad conditions and inconvenience as separating or peeling of adhered grains or formed films are entirely prevented.

Since the gas releasing property is also restrained, by using as the composing members for the walls of the process chamber of the evaporation or spattering, it is possible to process into processed products of high reliability usefully in maintenance and good yield. Further, as micro cracks as a starting point of the plasma etching are removed from the surface of the base material, the plasma resistance is accelerated, and influences by micro cracks are avoided, the problem about the thermal strain is controlled, and the composing members having high mechanical durability may be offered.

Further, it is possible to mass-produce the ceramic structural members not only having the excellent anchoring effect and the thermal strain resistance, but also restraining the gas releasing property and having the high reliability.

Explanation will be made to the chemical etching method of alumina ceramics effectively enabling the etching with reference to FIGS. 15 through 17.

Figure 15:
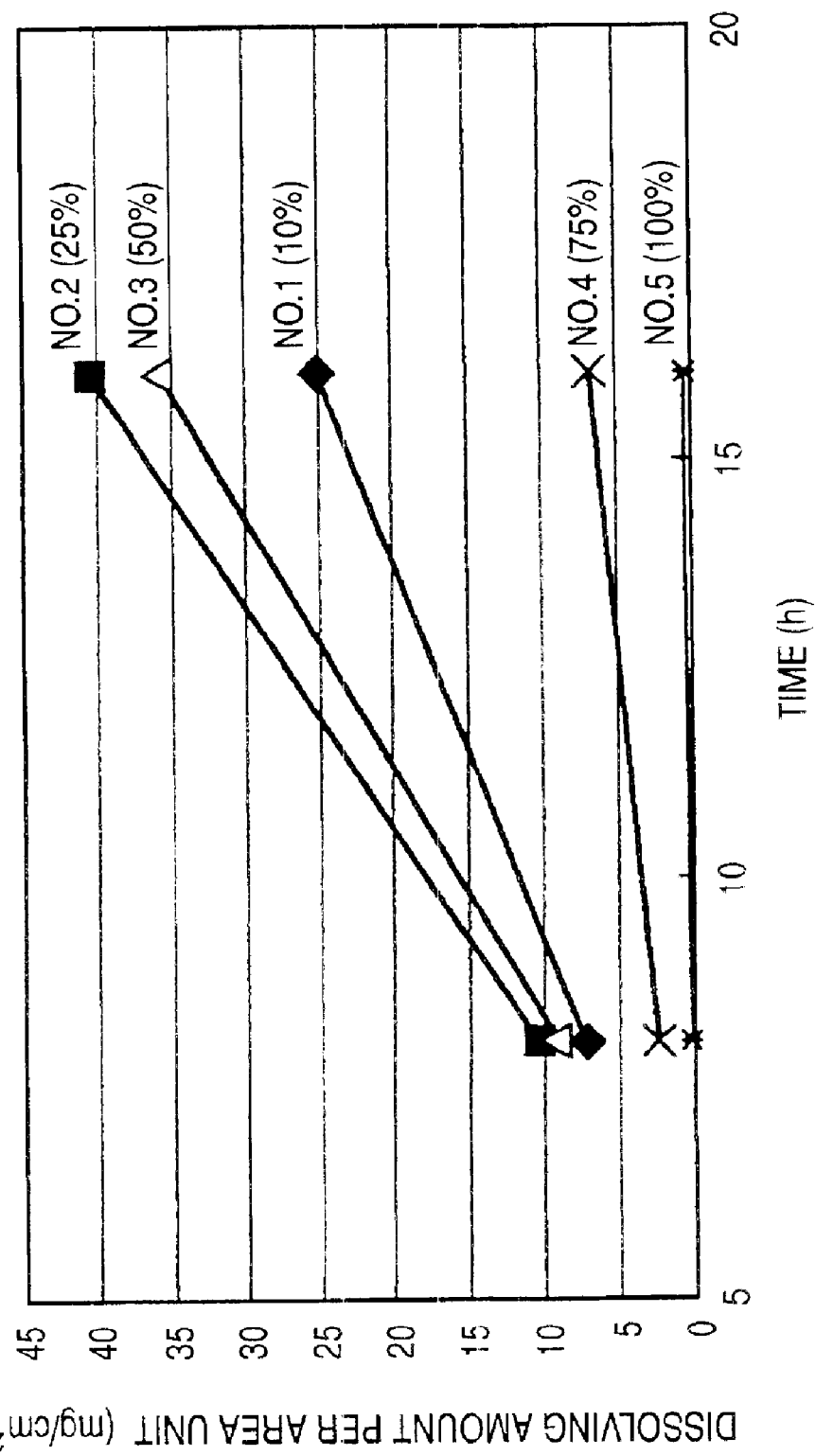
FIG. 15 shows an explanatory view showing the relationship between the density and the dissolving amount of sulfuric acid.

At first, for investigating the relationship between the density and the dissolving amount of the sulfuric acid, the alumina ceramic sheets (10×15×2 mm) of purity: 99.7%, bulky density: 3.97 g/cm$^2$ (99% of the theoretical density), and average grain diameters: 40 µm were immersed in the water solutions of the sulfuric acid of density: 10% (No. 1), 25% (No. 2), 50% (No. 3) and 75% (No. 4), and in the sulfuric acid of density: 100% (No. 5), and the water solutions of the sulfuric acid and the sulfuric acid were kept 230° C., and when measuring the dissolving amount per unit area of the alumina ceramics going with the time passing, it was as shown in FIG. 15, and the water solution of the sulfuric acid of Nos. 1 and 2 had the same density before and after using.

As seen from FIG. 15, No. 2 of the density of the sulfuric acid being 25% and No. 3 of 50% had the more dissolving amount per unit area than No. 1 of the density of the sulfuric acid being 10% and No. 4 of 75% and No. 5 of 100%.

For investigating difference in the dissolving rates by the density of the sulfuric acid, the same alumina ceramic sheets as mentioned above were immersed for 8 hours and 16 hours in the water solutions of the sulfuric acid of Nos. 1 to 4 and in the sulfuric acid of No. 5 kept the temperature at 230° C., the results were as shown in FIG. 1

Figure 16:
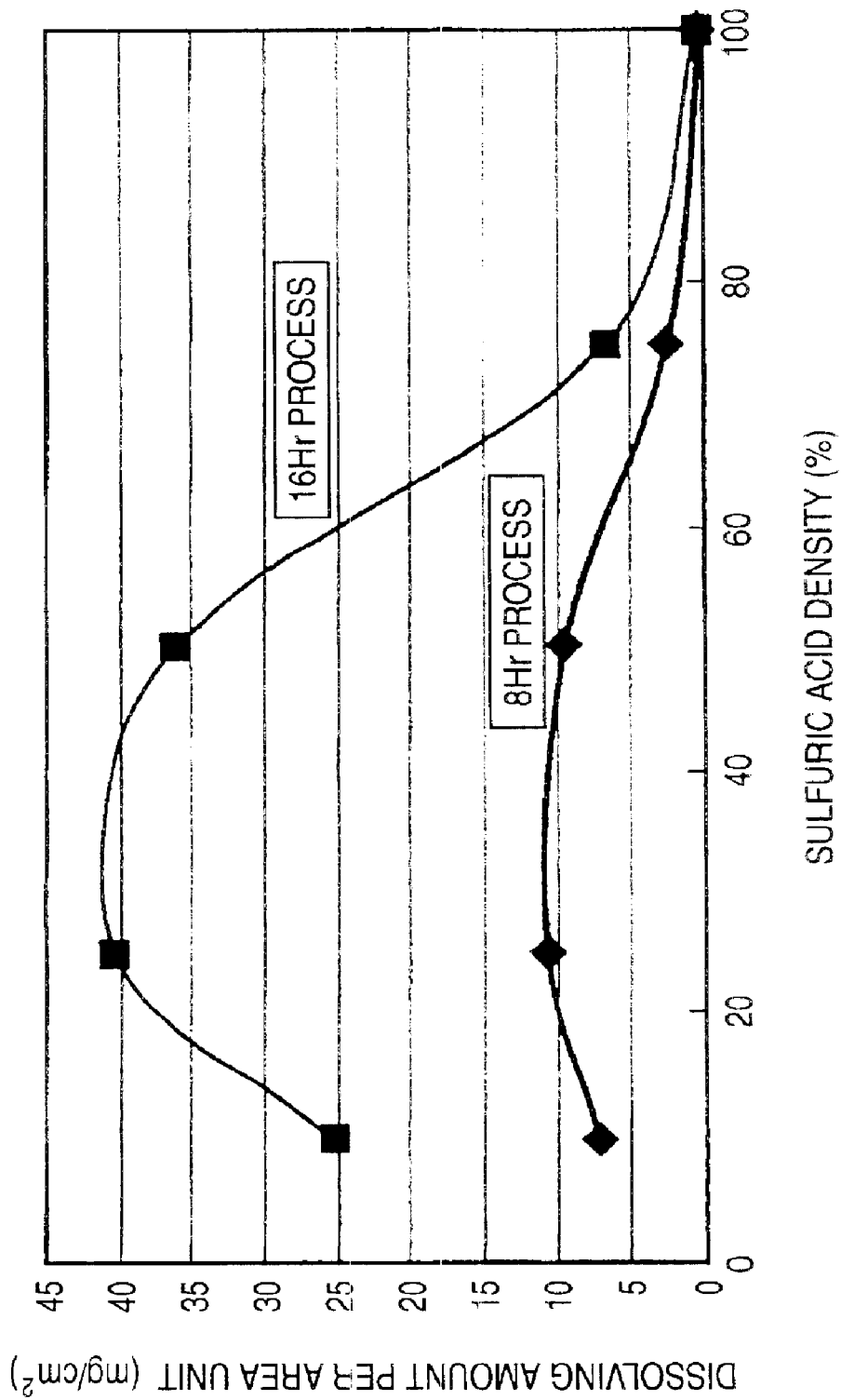
FIG. 16 shows an explanatory view showing the relationship between the density and the dissolving rate of sulfuric acid.

As seen from FIG. 16, if using, as the chemical etchant, the water solution of the sulfuric acid of the density being 18 to 50%, preferably 20 to 35%, the dissolving rate of the alumina ceramics can be heightened.

Figure 17:
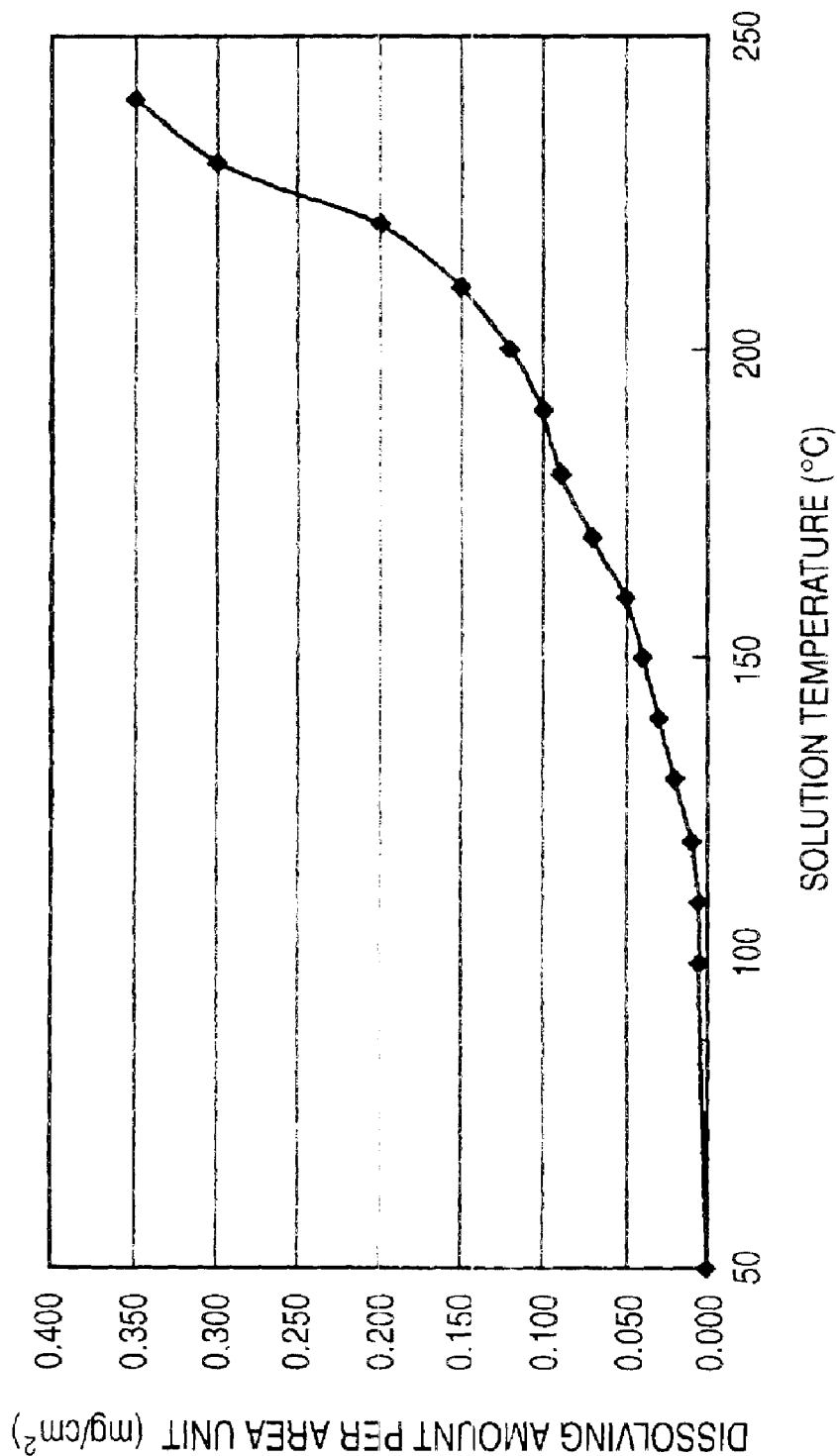
FIG. 17 shows an explanatory view showing the relationship between the temperature and the dissolving amount of sulfuric acid.

Next, for investigating the relationship between the temperature and the dissolving amount of the water solution of the sulfuric acid, the same alumina ceramic sheets as mentioned above were immersed for 16 hours in the water solution of the sulfuric acid of the 25% density kept the temperature at 50 to 240° C., and when measuring the dissolving amount per unit area of the alumina ceramics, the results were as shown in FIG. 17.

By the way, if the water solution of the sulfuric acid was heated up to 250° C., the solution was made unstable and dangerous.

Herein, when the same alumina ceramic sheets as mentioned above were immersed for 30 hours in the water solution of the sulfuric acid of the 25% density kept the temperature at 50 to 240° C. and the chemical etching was carried out, there was formed almost uniformly, on the surface of the alumina ceramic sheet, the round ruggedness of the surface roughness Ra (the average roughness of the center line) being 3.0 μm, and the density of the water solution of the sulfuric acid after using was substantially the same before.

As mentioned above, according to the chemical etching method of the alumina ceramics of the invention, aluminum sulfate as the reacted product is dissolved in the water solution of the sulfuric acid, and the density thereof may be kept almost constant for a long period of time, whereby the etching of alumina ceramics can be very effectively operated, and the water solution of sulfuric acid can be repeatedly used.

If the water solution of sulfuric acid is kept 100 to 250° C., the dissolving rate is heightened, so that the etching time can be by far shortened.

Depending on the above mentioned etching method to manufacture plasma resistant materials, tool plates of grinding apparatus, or artificial bones, each of them realized the anchoring effect and the good affinity with living bodies.

The present invention is not limited to the specific above-described examples. It is contemplated that numerous modifications may be made to the ceramic members of the present invention without departing from the spirit and scope of the invention as defined in the following claims. For instance, after forming a rugged structure containing fine pores with large diameter portions in a depth direction, a plurality of protrusions having smaller diameter than that of the crystal grain can be further formed on the surfaces of said fine pores.

What is claimed is:

1. A ceramic member having a purity of 95 wt % or higher and having a surface comprising crystal grains, wherein a crystal grain on the surface of the ceramic member comprises a plurality of protrusions having a smaller diameter than that of the crystal grain.

2. A vapor deposition apparatus comprising a ceramic member according to claim 1.

3. A method of producing a ceramic member, comprising treating a dense ceramic base material, having a purity of 95 wt % or higher, having a surface comprising crystal grains and having a density exceeding 90% of a theoretical density, by subjecting a surface of the dense ceramic base material to a corrosion treatment in an acid etchant, wherein a crystal grain on the surface of the ceramic member comprising a plurality of protrusions having a smaller diameter than that of the crystal grain that is formed.

4. The method of producing the ceramic member as set forth in claim 3, wherein the step of treating in an acid etchant further comprises heating the acid etchant at temperature of 100° C. or higher.

5. The method of producing the ceramic member as set forth in claim 4, wherein the acid etchant is (i) a sulfuric acid or a water solution thereof, otherwise (ii) a phosphoric acid or a water solution thereof.

6. The method of producing the ceramic member as set forth in claim 3, wherein the acid etchant is (i) a sulfuric acid or a water solution thereof, otherwise (ii) a phosphoric acid or a water solution thereof.

7. A surface rugged ceramic member, comprising a dense ceramic having a purity of 95 wt % or higher as a base material, wherein a surface layer of the base material comprises a rugged structure containing fine pores, wherein the fine pores have a diameter of 0.5 to 50 times the average grain diameter of the ceramic, and wherein large diameter portions of at least some of the fine pores are oriented in a depth direction.

8. The surface rugged ceramic member as set forth in claim 7, wherein the dense base material has the purity of 99 wt % or higher.

9. The surface rugged ceramic member as set forth in claim 8, wherein the dense base material is 90 wt % or higher of a theoretical density.

10. The surface rugged ceramic member as set forth in claim 8, wherein the dense base material comprises one or more of alumina, yttrium aluminum garnet, aluminum nitride, yttria, zirconia, or calcium phosphate based ceramics.

11. The surface rugged ceramic member as set forth in claim 7, wherein the dense base material is 90 wt % or higher of a theoretical density.

12. The surface rugged ceramic member as set forth in claim 7, wherein the dense base material comprises one or more of alumina, yttrium aluminum garnet, aluminum nitride, yttria, zirconia, or calcium phosphate based ceramics.

13. A vapor deposition apparatus comprising a surface rugged ceramic member according to claim 7.

14. A method of producing a surface rugged ceramic member, comprising treating a dense ceramic base material having a purity being 95 wt % or higher and having a density of more than 90% of a theoretical density, by subjecting the dense ceramic base material to a corrosion treatment which comprises subjecting a surface of the dense ceramic base material to an acid etchant, so that the surface layer comprises a rugged surface containing fine pores, wherein the fine pores have a diameter of 0.5 to 50 times the average grain diameter of the ceramic and wherein large diameter portions of at least some of the fine pores are oriented in a depth direction.

15. The method of producing the surface rugged ceramic member as set forth in claim 14, wherein the step of treating with an acid etchant further comprises heating the acid etchant.

16. The method of producing the surface rugged ceramic member as set forth in claim 15, wherein the acid etchant is pressurized with 0.2 MPa or higher.

17. The method of producing the surface rugged ceramic member as set forth in claim 15, wherein the acid etchant is a water solution containing sulfuric acid or phosphoric acid.

18. The method of producing the surface rugged ceramic member as set forth in claim 15, wherein the surface of the ceramic base material is subjected to a heat treatment at temperatures of ⅔ or higher of a melting point of the ceramic after the corrosion treatment with the acid etchant.

19. The method of producing the surface rugged ceramic member as set forth in claim 14, wherein the acid etchant is pressurized with 0.2 MPa or higher.

20. The method of producing the surface rugged ceramic member as set forth in claim 14, wherein the acid etchant is a water solution containing sulfuric acid or phosphoric acid.

21. The method of producing the surface rugged ceramic member as set forth in claim 14, wherein the surface of the ceramic base material is subjected to a heat treatment at temperatures of ⅔ or higher of a melting point of the ceramic after the corrosion treatment with the acid etchant.

22. A surface rugged ceramic member, comprising a dense ceramic base material having a purity of 95 wt % or higher, and average grain diameters of 10 to 70 μm, wherein a surface layer of the base material, within a depth from the surface of up to 5 times the average grain diameter, contains no pulverized layers, and wherein the surface layer comprises pores of a size on the order of the average grain size and oriented so that the pore is extended in the depth direction.

23. The surface rugged ceramic member as set forth in claim 22, wherein the dense ceramic base material has the purity of 99 wt % or higher.

24. The surface rugged ceramic member as set forth in claim 23, wherein the dense ceramic base material comprises one or more of alumina, yttrium aluminum garnet, aluminum nitride, yttria, or zirconia.

25. The surface rugged ceramic member as set forth in claim 22, wherein the dense ceramic base material comprises one or more of alumina, yttrium aluminum garnet, aluminum nitride, yttria, or zirconia.

26. A vapor deposition apparatus comprising a surface rugged ceramic member according claim 22.

27. A method of producing a surface rugged ceramic member, comprising subjecting a surface of a dense ceramic base material having a purity of being 95 wt % or higher and having an average grain diameters being 10 to 70 μm to a corrosion treatment on in an acid etchant, and removing a pulverized layer from a ceramic processed surface within a depth from the surface of up to 5 times the average grain diameter to produce a ceramic member wherein the surface layer comprises pores of a size on the order of the average grain size and oriented so that the pore is extended in the depth direction.

28. The method of producing the surface rugged ceramic member as set forth in claim 27, wherein the acid etchant is a water solution containing sulfuric acid or phosphoric acid.

* * * * *